United States Patent [19]

Ledniczki et al.

[11] 4,221,975
[45] Sep. 9, 1980

[54] TOUCH ACTIVATED CONTROLLER AND METHOD

[75] Inventors: Ferenc Ledniczki, Foster City; Richard J. Patak, San Jose; Ronald G. Wayne, Milpitas, all of Calif.

[73] Assignee: Touch Activated Switch Arrays, Inc., Santa Clara, Calif.

[21] Appl. No.: 897,686

[22] Filed: Apr. 19, 1978

[51] Int. Cl.² .................. G08C 9/02; H01H 35/00
[52] U.S. Cl. ............................ 307/116; 340/365 C
[58] Field of Search ............... 340/365 C, 337, 332, 340/325, 21, 524; 328/5; 307/116, 119, 120, 121, 122, 123, 149, 152; 84/DIG. 7; 361/181

[56] References Cited

U.S. PATENT DOCUMENTS

| | | | |
|---|---|---|---|
| T904,088 | 11/1972 | Crouse | 340/365 C |
| 3,648,029 | 3/1972 | Ungnadner | 340/21 X |
| 3,786,497 | 1/1974 | Davis | 340/365 C X |
| 3,921,166 | 11/1975 | Volpe | 340/365 C |
| 4,121,204 | 10/1978 | Welch et al. | 361/181 X |

*Primary Examiner*—L. T. Hix
*Assistant Examiner*—James L. Dwyer

*Attorney, Agent, or Firm*—Flehr, Hohbach, Test, Albritton & Herbert

[57] ABSTRACT

A touch activated controller generates UP/DOWN control signals in response to movement of a human finger (or other comparable contact) along a control surface thereof. The UP information is derived from movement of the finger in one direction and the DOWN information is derived from movement in a substantially opposite direction. This system generates a sequence of control signals in one or the other of the two directions. In addition, when the finger is removed from the device the output remains in its last previous state or condition existing before removing the finger. Thus, the logic of the system is sensitive substantially to motion and direction of movement so that the logic of the operation of the device closely resembles the motion of a thumbwheel control. Merely placing a finger on the surface of thumbwheel or on the surface of the disclosed device generates no change in the position of the thumbwheel or the output of the device herein. When a finger is moved in one direction while in contact with the control surface of the device or the thumbwheel the output of the device will generate control signals counting up or down depending on the direction of movement of the finger.

9 Claims, 10 Drawing Figures

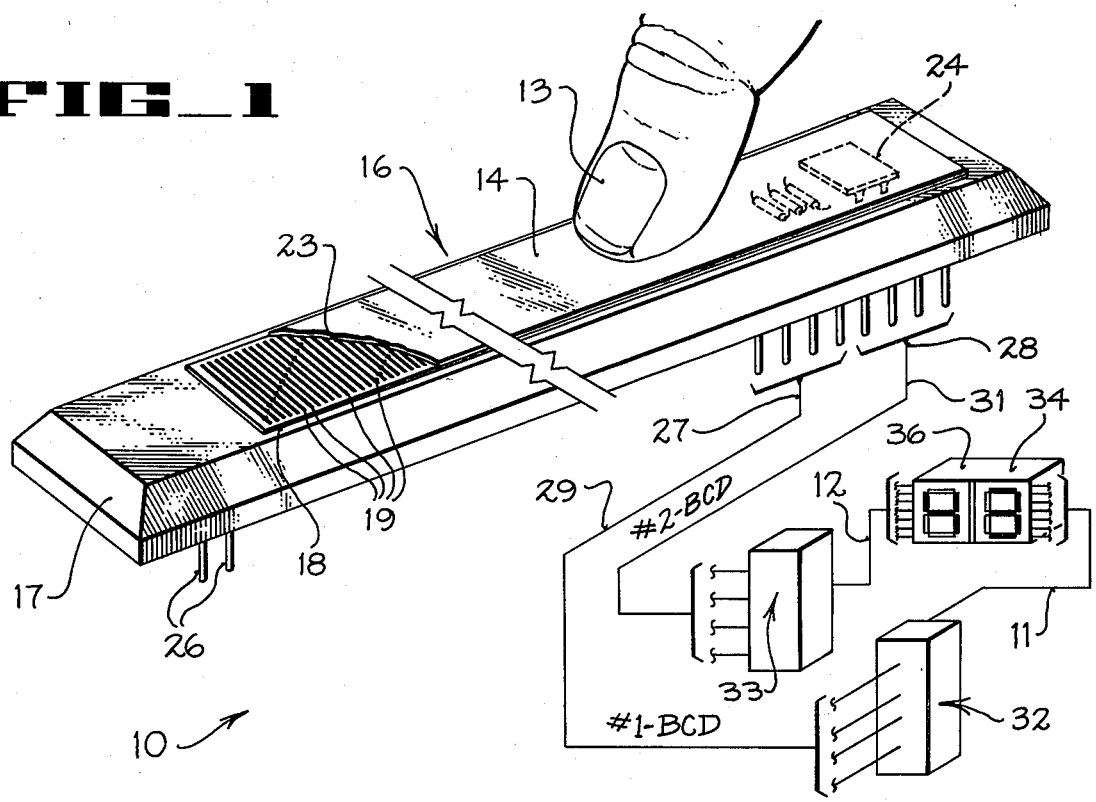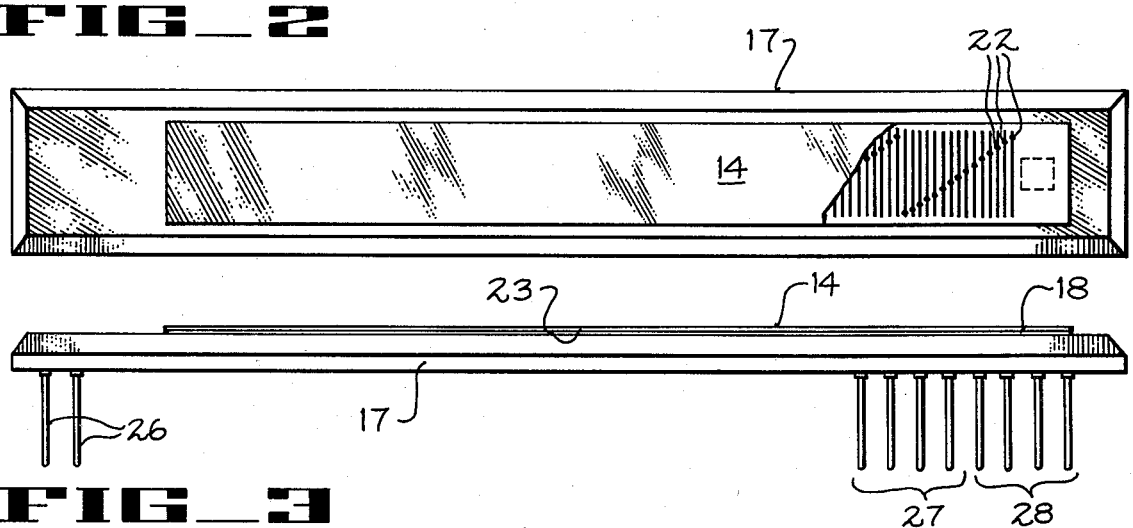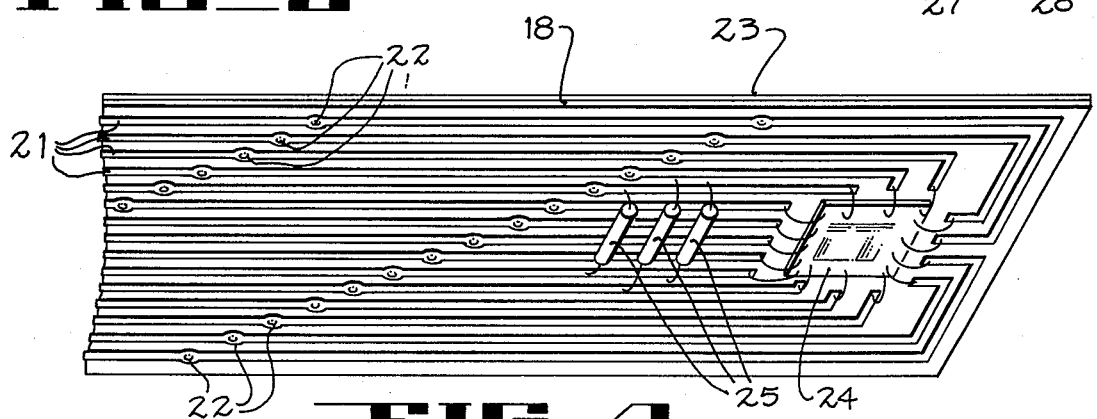

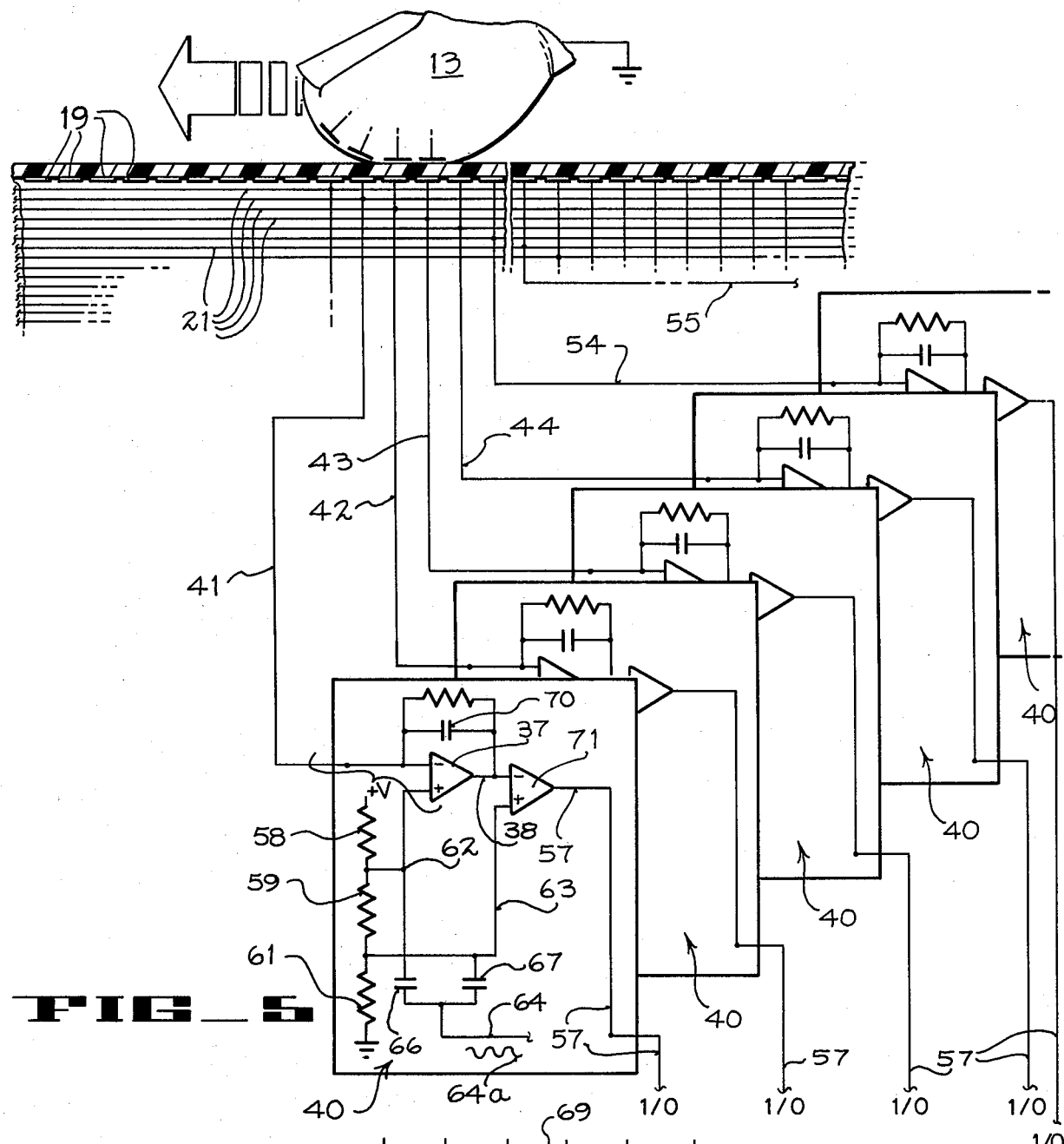
FIG_5
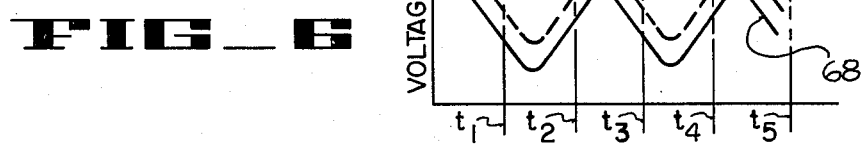
FIG_6
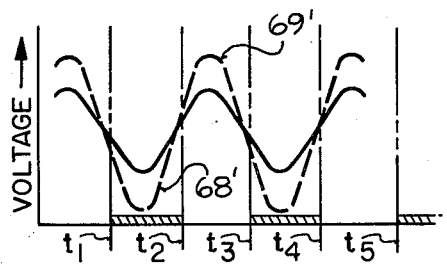
FIG_7

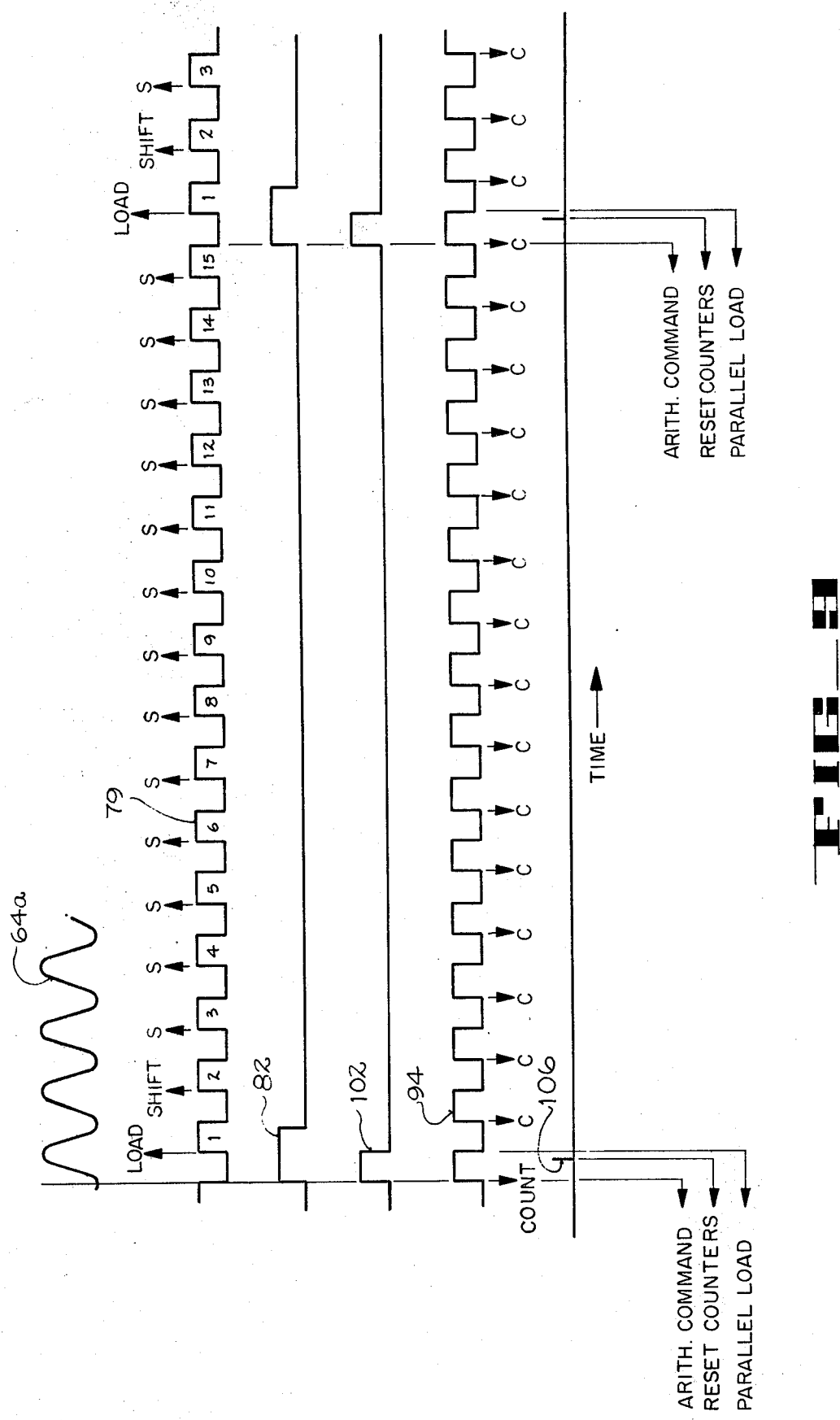

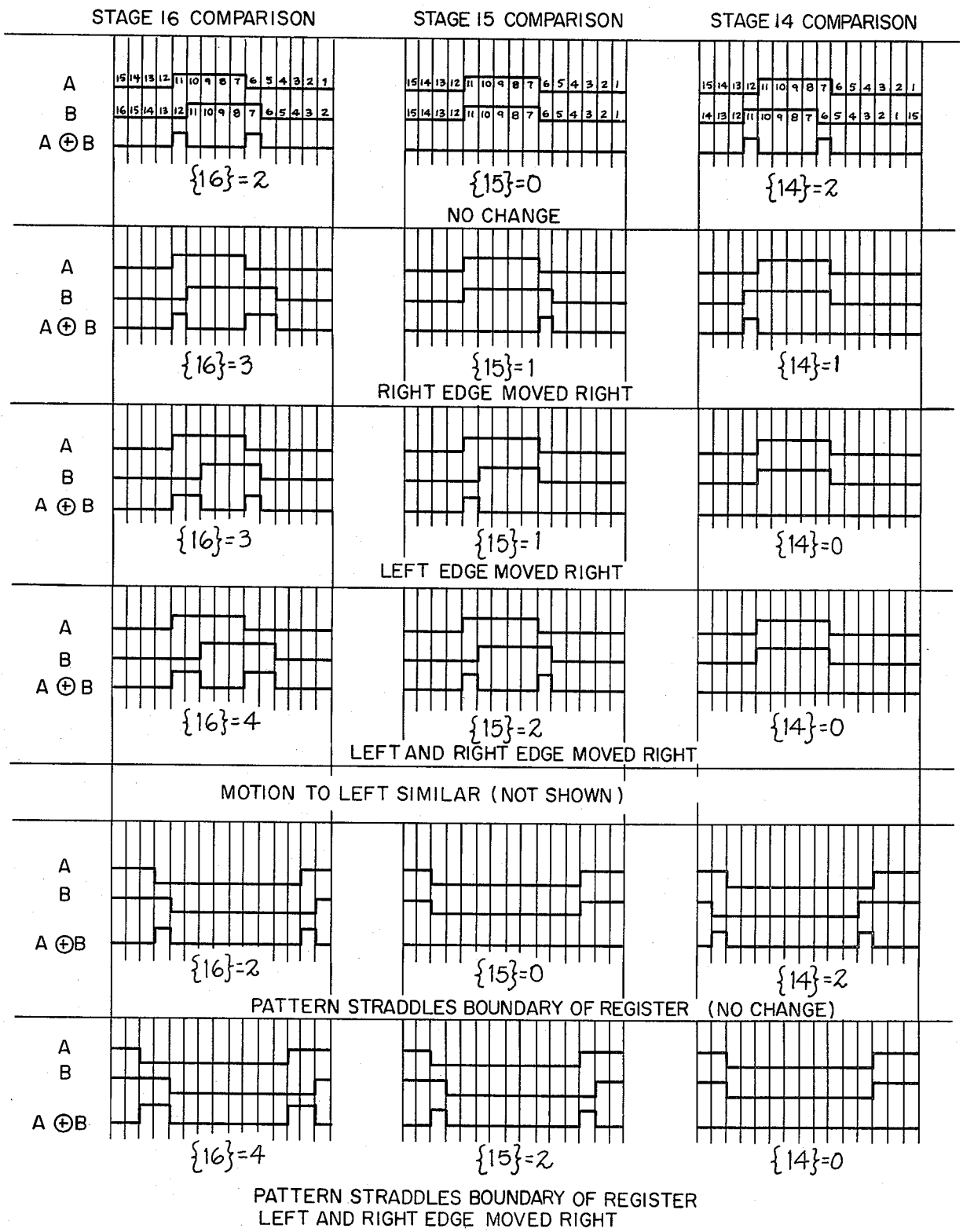

TOUCH ACTIVATED CONTROLLER AND METHOD

BACKGROUND OF THE INVENTION

This invention pertains to a touch activated controller and method and more particularly to a touch activated controller and method particularly useful to function as an electronic thumbwheel control.

Heretofore circuits operated in response to the touch have been known. Some of these circuits employ means for introducing energy into the system in order to effect their purposes as opposed to the present system wherein energy is taken out of the system as described further below.

SUMMARY OF THE INVENTION AND OBJECTS

In general, a touch activated controller for generating signals adapted to be coupled to operate apparatus in response thereto comprises a body of insulating material and a series of discrete sense lines forming portions of capacitors carried in closely spaced relation by the insulation material. Each of the sense lines functions as one plate of a capacitor when in the proximate presence of the person's finger or other body portion. A series of discrete sensing circuits are respectively associated with related ones of the sense lines. The circuits serve to generate a first digital output in response to the absence of a body portion at a sense line associated therewith and a second digital output in response to the presence of a body portion thereat so as to sense and indicate the presence of a body portion in proximity to each of the sense lines. Means are coupled to the last named means for generating a sequence of control signals representing increasing or decreasing information dependent upon movement of the human finger or other body part across the sense lines in one or another of two substantially opposite directions.

In general it is an object of the present invention to provide an improved controller device and method capable of being operated by movement of a person's finger or comparable contact across a control surface without movement of operative parts, other than the person's finger.

It is another object of the present invention to provide such a touch activated circuit which is significantly more sensitive to the contact of a person's finger so that very small sensor lines can be employed and hence packed very closely together. In this manner greater resolution can be obtained.

Another object of the invention is to provide a touch activated controller and method in which the output formation generated for controlling devices is made to vary at a rate and to a degree corresponding to that of the movement of a person's finger across the control surface of a touch activated controller.

Yet another object of the invention is to provide a touch activated controller employing a minimum of detector circuits each cooperating with a plurality of sense lines or inputs.

Yet an additional object of the invention is to provide a touch activated controller in which the digital output information is caused to vary in response to the rate and displacement of finger movement along a series of sensing elements as detected by comparing the results of part sensing status with present sensing status so as to create something of an electronic "thumbwheel".

Yet a further object of the invention is to provide a touch activated circuit in which no direct electrical contact is required to be made by the operator.

The foregoing and other objects of the invention will become more clearly evident from the following detailed description of a preferred embodiment when considered in conjunction with the drawings.

BRIEF DESCRIPTION OF THE DRAWINGS

FIG. 1 shows a diagrammatic perspective view partially broken away of a touch activated controller system according to the invention;

FIG. 2 shows a diagrammatic top plan view partially broken away of a touch activated controller according to the invention;

FIG. 4 shows a diagrammatic perspective view, as viewed from beneath, of an intermediate substrate portion of the touch activated controller device as shown in FIG. 1 through 3;

FIG. 5 shows a diagrammatic side elevation section view of a portion of the substrate of FIG. 4 but with the conductive channels of the underside of the substrate being diagrammatically shown disposed in exploded relation away from the level of the layer of the substrate for illustration and also including a series of circuits disposed in an exploded perspective arrangement for explanation purposes only;

FIGS. 6 and 7 show diagrammatic graphs employed in the explanation of the functioning of a circuit of the type shown in FIG. 5;

FIG. 8 shows a diagrammatic block diagram of the overall system according to the invention;

FIG. 9 shows a timing diagram for use in conjunction with the master clock of FIG. 8; and FIG. 10 shows a series of charts representative of the signals appearing at various outputs of the two shift registers of the system as well as providing pulses representative of the exclusive OR function, all as occurring in the system according to FIG. 8.

DETAILED DESCRIPTION OF A PREFERRED EMBODIMENT

Figure 3:
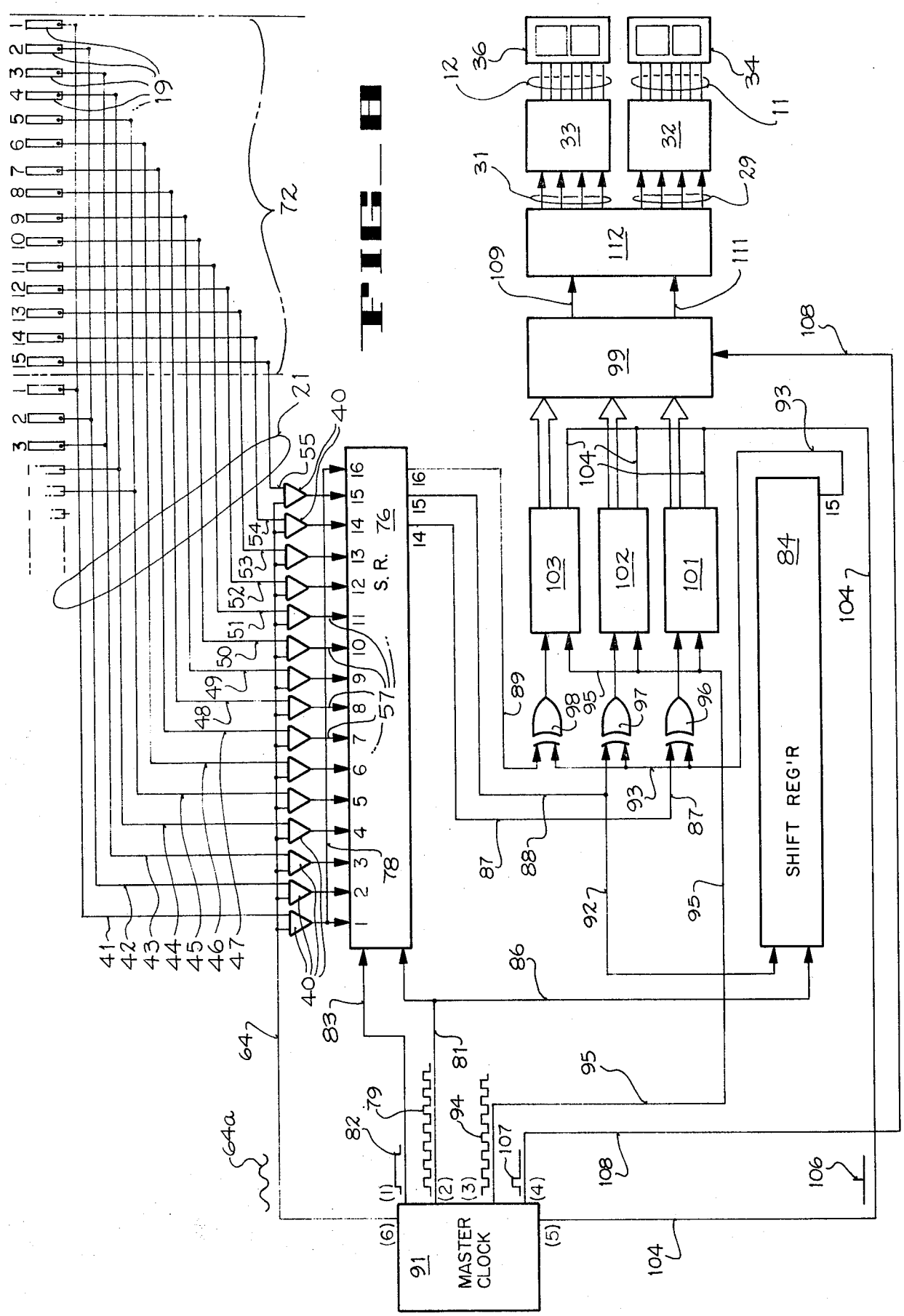
FIG. 3 shows a side elevation diagrammatic view of FIG. 2 according to the invention.

As shown in FIG. 1 a touch activated controller system 10 is shown of a type for generating a sequence of control signals via output leads 11, 12 wherein the sequence of control signals represents increasing or decreasing information depending upon the direction of movement of a person's finger 13 or other body part across the surface 14 of the controller assembly 16. In general, controller assembly 16 includes a support body 17 which carries a layer 18 of insulating material of a type adapted to receive printed circuit elements and leads on top and on the bottom.

A series of conductive elements 19 disposed transversely upon the obverse surface of layer 18 using known printed circuit techniques are arranged in uniformly spaced apart relation distributed along the length of the top of layer 18. A series of conductors 21 carried on the reverse side of layer 18 extend longitudinally therealong substantially normal to the direction of the conductive elements 19. Conductors 21 are spaced substantially uniformly apart laterally across the width of the reverse side of layer 18 so that conventional lead through connections 22 can serve to interconnect successive ones of elements 19 to successive ones of conductors 21.

That portion of layer 18 which carries conductive elements 19 is subdivided into seven groups 72 (FIG. 8) of fifteen elements 19 each. The first element 19 of each group is connected by means of a conventional lead through connection 22 to a common one of the fifteen conductors running longitudinally beneath layer 18. Similarly, the second element of each group is connected to a second common one of the fifteen longitudinal conductors, and so on. Accordingly, as thus arranged, the lead through connections 22 provide means interconnecting successive ones of the conductive elements 19 to successive ones of the conductors 21.

A plastic protective layer 23 having a thickness of the order of 0.003 of an inch overlays the top surface of layer 18 so as to provide a smooth surface upon which a finger may be placed and also providing an insulating barrier preventing electrical contact between the finger and the electrical conductive elements 19.

Controller assembly 16 further includes circuitry 24 as described further below in the form of one or more monolythic integrated circuit chips and other microminiature electronic components. Components 25 as shown only represent these circuit components and do not show the actual placement of said components within the assembly. Components 25 merely serve as a representation of components employed in the system as shown in FIG. 8.

The controller unit 16 as thus arranged can be plugged into a system wherein the pins 26 cooperate with a suitable power supply and two groups 27, 28 of pins supply a first and second binary coded decimal digit via leads 29, 31 to form the input to conventional conversion units 32, 33. Units 32, 33 convert the binary coded decimal input to a seven segment output signal on output lines 11 and 12 for operating the seven segment displays 34, 36 associated respectively with the first and second decimal digits. These seven segment displays, as is known, are capable of clearly displaying the digits from 0 to 9.

As shown in FIG. 4 body 17 has been removed for clarity so that the connections to circuitry 24 and associated electronic elements represented diagrammatically by elements such as 25 can be more readily observed.

As an activator, such as a person's finger, moves along surface 14 passive elements 19 provide active inputs to the system. Thus, the finger serves to complete the formation of a capacitor coupled as an input to each of a number of sensing circuits 40. Thus a human finger 13 activates each input 41-55 since the finger forming a pad with uniform minimum spacing (defined by layer 23) between the surface of the skin over a broad area of conductive elements 19. In this way portions of the skin area can be considered to constitute the equivalent of a plate of a capacitor while the conductive elements 19 serve to form the other plate so that upon disposing the finger in the proximate presence of element 19 a capacitor is formed coupled to ground via the body.

While an equivalent form of contact or other activator can be formed to operate the system herein, the present system will be described with respect to its operation in response to movements of a finger across the surface 14 of layer 23 having in mind that other types of activator can also be used to develop similar inputs.

Inasmuch as elements 19 are used to sense the presence or absence of a finger (or other comparable contact) these elements are referred to hereinafter as sense lines.

A plurality of touch activated circuit means 40 associated with each of the plurality of sense lines 19 serve to provide a digital output of "1" or "0" with respect to the status of each sense line associated therewith. A digital "1" indicates the proximate presence of a person's finger in association with the given sense line, and a "0" the absence.

Each of a plurality of touch activated circuits 40 is associated with a plurality of related sense lines.

As described further below, the output of the system will remain constant in the event there is no movement, (just as a thumbwheel standing still). Thus, sufficient spread must exist between the first and the last sense line 19 in each group so that there is little likelihood that the finger will cover all sense lines simultaneously. With all lines 19 covered it is not possible to determine motion of the finger using the arrangement described further below. Thus, the spread between the first and last sense line within each group thereof is deemed to be a "maximum fingerprint" 72. Note that all circuits are the same. However, to assist in explanation their input leads 41-55 are shown. Accordingly, these leads are each coupled to an associated circuit 40 to provide the input thereto. Inasmuch as each of the touch activated circuits 40 associated with input lines 41-55 is the same, a description of a single circuit 40 is believed to be a sufficient description of the remaining circuits 40 herein.

Operation of each circuit 40 is dependent upon the fact that the presence of a person's finger (or other comparable object) in close relation to any one of the sense lines 19 serves to create something of a limited capacitance therewith in which the associated sense line 19 constitutes one of the two plates of a capacitor while the person's finger constitutes the other plate coupled to ground through the finger as shown in FIG. 5. It is not necessary for the finger to have any electrically conductive path connected to ground either directly or through the person, since a human will necessarily have a relatively large capacity to ground by virtue of the large physical size with relation to the capacitors found between the finger and the sense lines. This large capacity to ground effectively renders the finger to be at ground potential.

Circuits 40 are arranged whereby in the absence of a capacitance located on the input leads 41-55 thereof the output lead 57 will provide a digital zero. On the other hand when a person's finger is sufficiently close to one of the sense lines 19, i.e. to be in the "proximate presence" of a sense line 19, so as to cause it to constitute a capacitance on the input line of the circuit, the output on lead 57 becomes a digital "1" as now to be described.

With reference to each of the circuits 40 it is evident that a voltage divider comprised of resistors 58, 59, 61 provides a first voltage level at point 62 which is higher than the voltage level provided on line 63. A signal of substantially two volts amplitude and substantially 20 khz frequency is impressed upon the voltage levels at point 62 and line 63 by means of an oscillating signal 64a via lead 64 from a master clock 91. This signal 64a appears on both lines 62 and 63 equally via the pair of capacitors 66, 67 connected in common to lead 64. The only difference between the signals on 62 and 63 is that the voltage at 63 is normally instantaneously slightly below that of the voltage at 62. This relationship is shown in the graph of FIG. 6 wherein a trace 68 of the voltage on lead 63 follows trace 68 but represents the voltage at point 62 so as to remain slightly below trace 69.

When sense line 19 is not in the proximate presence of a finger the resulting value of capacitance associated with input line 41 (or input lines 42–55 for the remaining circuits 40) is zero or near zero. Under these conditions, the voltage at 38 from operational amplifier 37 will be at or nearly equal to the voltage at 62.

When a sense line 19 associated with input 41 is "touched" the input capacitance developed on lead 41 takes a value of the order of 2 pf (pico farad). By supplying a capacitor 70 also of substantially 2 pf, the output of operational amplifier 37 becomes substantially greater. For example, as shown with regard to the graph in FIG. 7 it will be noted that when the amplitude of the output on lead 38 from operational amplifier 37 is larger (as occurs when the sense lines 19 are active) the voltage of a portion of each cycle (indicated by the time between $t_1$ and $t_2$ and the time between $t_3$ and $t_4$) drops (along trace 69') below the voltage of trace 68'. During these times comparator 71 indicates that voltage on trace 69' is less than the voltage on trace 68'. At this point its output on lead 57 changes from a digital "0" to a digital "1".

As shown in FIG. 8 a series of fifteen touch activated input amplifier circuits 40 (with associated input lines 41 through 55) are each coupled to an associated one of sense lines 19 from each of the plurality of groups 72 thereof to cyclically provide digital input data to the system as a person's finger moves along surface 14 sequentially activating amplifiers 40 in each group 72 and as finger 13 moves from group to group.

The system shown in FIG. 8 comprises a first shift register 76 which constitutes a so-called "present register", i.e. the data in register 76 represents the present position of the finger 13 along surface 14. Shift register 76 is parallel loaded with a pattern of binary digits representing activated and inactivated outputs 57 as above described. The sequence of parallel loading and the like is described further below. At this point, it is to be noted that the input signal on entry lead 57 is also coupled via line 78 to constitute a corresponding entry at the 16th stage of shift register 76.

In order to load all outputs 57 in parallel into shift register 76, signal 64a from master clock 91 is fed in parallel by lead 64 to each of circuits 40. As explained above with respect to FIGS. 5 and 7 a digital "1" will be generated from each circuit 40 whenever the voltage at point 62 drops below the voltage on line 63. The parallel loading of register 76 is timed under control of a load command pulse 82 from master clock 91 delivered to register 76 via lead 83. The load command pulse occurs sometime between $t_1$ and $t_2$ (or $t_3$ and $t_4$) such that if the sense circuitry is activated, a digital "1" will be parallel loaded in shift register 76, and if the sense circuitry is not activated, a digital "0" will be parallel loaded into shift register 76.

The sixteen stages of register 76 are numbered 1–16 respectively. Data in each stage of register 76 is shifted the length of register 76 in response to stepping pulses 79 from clock 91 via lead 81.

A second shift register 84 comprised of fifteen stages constitutes a so-called "delayed register" to be used to store prior data from the "present" shift register 76. Thus, when register 76 is parallel loaded register 84 will contain the pattern which was previously loaded into register 76.

In addition data is shifted through register 84 conjointly with 76 by supplying the same series of stepping pulses 79 via lead 81 both to shift register 76 and also to shift register 84 via the inter-connection 86.

Shift register 76 includes a plurality of output stages for comparing the data at stages 14, 15 and 16 (represented by leads 87, 88, 89) comparing with that of stage 15 in register 84. Inasmuch as each parallel loading of register 76 serves to establish an information pattern in fifteen stages thereof to be compared to the fifteen stages in register 84, lead 88, connected to the fifteenth stage of register 76 joins lead 92 so as to constitute the data input to shift register 84 whereby the pattern of binary digits in register 76 can be shifted into register 84.

In order to be able to make rapid comparisons of the signals applied to the various input lines 41–55 as a person's finger moves along surface 14 the fifteenth output stage of 84 is connected via lead 93 to supply one of the inputs to each of three exclusive OR circuits 96, 97, 98. The foregoing exclusive OR circuits serve to provide an output signal of "1" only if the two inputs to the exclusive OR circuit are different. Accordingly, the two inputs to exclusive OR circuit 96 comprise leads 97 and 93. For circuit 97 the two inputs are derived from the fifteenth stage of shift register 76 via leads 88, 92 and the second input is supplied via lead 93 representing the fifteenth stage of shift register 84. Finally, the two inputs to circuit 98 are derived via lead 89 from the sixteenth stage of shift register 76 via line 89 and from the fifteenth stage of shift register 84 via lead 93.

It should be noted that the outputs from stages 14, 15 and 16 differ only in that the output from stage 14 occurs one clock pulse earlier than that from stage 15, that is, is left shifted on graph of output versus time, and the output from stage 16 occurs one clock pulse later than that from stage 15, i.e. right shifted on a graph of output vs. time.

Exclusive OR circuit 96 compares the left shifted loaded pattern with the previous loaded pattern. Exclusive OR circuit 97 serves to compare the loaded pattern with the previously loaded pattern, while circuit 98 compares the right shifted loaded pattern with the previous loaded pattern.

Counters 101, 102, 103 serve to count each time that a difference is noted by an associated one of the exclusive OR circuits 96–98 for each of the fifteen register positions being compared. Clock pulses 94 supplied to counters 101–103 via lead 95 serve to "enable" counters 101–103 to count once for each clock pulse 94 whenever the associated input from exclusive OR circuits 96–98 is high. Counters 101–103 do not count if the input is low.

The output of counters 101–103 is fed directly to an arithmetic unit 99 for processing the input data. In addition, clock 91 also serves via lead 104 to provide a reset pulse 106 to counters 101–103 at a proper time.

Just before the comparison, counters 101–103 are reset to zero. After they have received their fifteenth pulse, a command pulse 107 on lead 108 (coupled to arithmetic unit 99) causes unit 99 to put out its required UP/DOWN count by operating on the results of the complete cycle of fifteen comparisons. The output from arithmetic unit 99 appears on lines 109, 111 wherein the UP counting information is transmitted via line 109 and the down counting information is transmitted via line 111 to an UP/DOWN counter 112 in the form of a decade counter. The output from counter 112 provides a first binary coded decimal number on the four leads 29 and a second binary coded decimal number on the four leads 31. Leads 29 and 31 are respectively coupled to an associated binary coded decimal to seven segment coding units 32, 33 so as to provide a decimal output at each of the two seven segment displays 34, 36.

In operation arithmetic unit 99 performs the following logic and provides outputs on lines 109, 111 just before counters 101-103 are cleared by reset signal 106 on line 104 every time a pattern of digital inputs is parallel loaded into shift register 76.

For example, if the count in counter 103 (fed by stage 16 through exclusive OR circuit 98) is greater than the count of counter 101 (fed by stage 14 via exclusive OR circuit 96) and at the same time the count in counter 103 (fed by stage 15 through exclusive OR circuit 97) exceeds the count in counter 101 (fed by stage 14 through OR circuit 96), then the output is two pulses UP on line 109. The foregoing relationship is represented as:

| INPUT | OUTPUT |
|---|---|
| {16} . {14} > {15} = {14} | 2 Pulses UP |

Thus, the representation A>B means A is greater than B, and the mid-line period symbol (·) represents the logical "AND" symbol which means that expressions on both sides of (·) are true.

Thus, the above example "states" if the value of stage 16 is greater than the value of stage 14, AND if the value of stage 15 is greater than that of stage 14, then the output is two pulses UP on line 109.

In addition the following logic is performed:

| INPUT | OUTPUT |
|---|---|
| {16} > {15} . {14} = {15} | 1 Pulse UP |
| {14} > {15} . {16} = {15} | 1 Pulse DOWN |
| {14} > {16} . {15} > {16} | 2 Pulses DOWN |

For all other results no pulse is developed.

FIG. 10 employs this logic.

As shown in FIG. 9 a timing diagram is provided indicating the sequence of operations of the system shown in FIG. 8 as explained above.

The function and operation of the system in FIG. 8 can be diagrammatically indicated by the graphical representations shown in FIG. 10 using the above logic.

For example, as shown in the top row of graphs in FIG. 10, the information shown generates no pulse. UP or DOWN since no specific logic line corresponds to the conditions stated specifically in the logic above.

The information represented in the second row corresponds to the second line of logic to generate 1 pulse UP.

We claim:

1. A touch activated controller for generating signals adapted to be coupled to operate apparatus in response thereto comprising a body of insulating material, a series of discrete capacitor portions carried in closely spaced relation by said insulation, said series including a plurality of groups of said portions disposed in tandem, the minimum displacement between the first and last said portion in each group being greater than the maximum fingerprint of the operator to inhibit simultaneous operation of all said portions of a given group, each of said portions serving to function as one plate of a capacitor when in the proximate presence of a person's finger or other body portion, a series of discrete sense amplifying circuit means respectively associated with related ones of said capacitor portions, said circuit means serving to provide a first digital output in response to the absence of a body portion at a discrete capacitor portion associated therewith and a second digital output in response to the presence of a body portion thereat, groups of said sense amplifying circuit means being operated to said second condition, means coupled to said series of sense amplifying circuit means serving to generate an associated sequence of control signals upon movement of the human finger or other body part across said series of discrete portions in one or another of two substantially opposite directions, said sequence of control signals representing increasing or decreasing information dependent upon the direction of movement of the finger.

2. In a touch activated controller for generating a cyclic sequence of control signals representing increasing or decreasing information dependent upon the direction of movement of a human finger or other body part thereacross, a support body, a layer of insulating material carried by said body, a series of conductive elements carried on the obverse surface of said layer in spaced apart relation distributed along said obverse surface and adapted to be disposed and spaced sufficiently closely so that a human finger can be moved in a continuous plane thereacross from one to the next while continuously overlapping a plurality of each of said conductive elements in the proximate presence thereof, each of said conductive elements serving to form a capacitor portion, a series of conductors carried on the reverse side of said layer and extending therealong, said conductors being spaced laterally apart and distributed across the width of said reverse side, and means interconnecting successive ones of said conductive elements to successive ones of said conductors to couple to said conductors the equivalent of a capacitor whenever a human finger or body part is in the proximate presence of one of said conductive elements.

3. A touch activated UP/DOWN controller for generating signals adapted to be coupled to operate apparatus in response thereto comprising a body of insulating material, a series of discrete passive portions carried by said insulation and disposed so that a human finger can be moved in a continuous plane thereacross from one to the next while continuously overlapping a plurality of said passive portions in the proximate presence of each, a series of discrete sensing circuit means respectively associated with related ones of said passive portions, said portions serving to develop an input signal for said circuit means when in the proximate presence of a person's finger or other body portion, said circuit means serving to provide a first digital output in response to the absence of a body portion at a discrete passive portion associated therewith and a second digital output in response to the presence of a body portion thereat, means coupled to said series of sensing circuit means serving to generate a sequence of control signals upon movement of the human finger or other body part across said series of discrete portions in one or another of two substantially opposite directions, said sequence of control signals representing increasing or decreasing information dependent upon the direction of movement of the finger.

4. In a touch activated controller for generating a cyclic sequence of control signals representing increasing or decreasing information dependent upon the direction of movement of a human finger or other body part thereacross, a support body, a layer of insulating material carried by said body, a series of elements carried on the obverse surface of said layer in spaced apart relation distributed along said obverse surface and adapted to be oriented so that a human finger can be moved thereacross in over lapping relation therebetween from one group thereof to another, each of said elements serving to develop a signal when in the proximate presence of a human finger or other body part, a series of conductors carried on the reverse side of said layer and extending therealong to carry said signals, said conductors being spaced laterally apart and distributed across the width of said reverse side, and means interconnecting successive groups of said elements to successive groups of said conductors to couple to said conductors said signals wherever a human finger or body part is disposed in the proximate presence of one of said conductive elements.

5. In a touch activated controller for generating signals adapted to be coupled to operate apparatus in response thereto comprising a body of insulating material, a series of discrete passive portions carried in closely spaced relation by said insulation, a series of discrete sensing circuit means respectively associated with related ones of said passive portions, said portions serving to develop an input signal for said circuit means when in the proximate presence of a person's finger or other body portion, said circuit means serving to provide a first digital output in response to the absence of a body portion at a discrete passive portion associated therewith and a second digital output in response to the presence of a body portion thereat, means coupled to said series of sensing circuit means serving to generate a sequence of control signals upon movement of the human finger or other body part across said series of discrete portions in one or another of two substantially opposite directions, said sequence of control signals representing increasing or decreasing information dependent upon the direction of movement of the finger, the last named means including a first shift register having a plurality of at least as many stages as said series of sense amplifying circuit means, said stages being coupled in parallel to said series of discrete amplifying circuit means, means for loading said outputs of said series of sense amplifying circuit means in parallel into said first shift register, a plurality of output connections leading from a sequence of stages of said first shift register, a second shift register having a plurality of at least as many stages as said series of sense amplifying circuit means, one of said plurality of output connections from said first shift register being coupled to serially supply a digital input to said second shift register, and means for stepping information stored in the stages of both shift registers conjointly therethrough.

6. In a touch activated controller according to claim 5 further comprising means for comparing the state of the last stage of said second shift register to the state of each of said sequence of stages of said first shift register and for counting each disparity detected therebetween separated according to each of said stages of said sequence of stages to provide a count associated with each.

7. In a controller for generating signals adapted to be coupled to operate apparatus in response thereto comprising touch activated sense amplifying means responsive to the movement of a human finger thereacross in each of two directions for generating a cyclic sequence of binary signals derived from direction and displacement of said finger, means for detecting said direction and the degree of said displacement by comparing said signals in relation to elapsed time, the last named means including a first and second shift register in which data is advanced conjointly therethrough in response to clock pulses applied in common to both said registers, and means for loading said signals in parallel into said first shift register, the input of said second shift register being coupled to the output of a predetermined stage of said first shift register, and means for comparing the binary states of both said shift registers as a function of time and counting differences between the binary state of each stage of one shift register with respect to the corresponding stage of the other shift register.

8. A touch activated controller comprising a supporting layer of insulating material, a series of elements distributed in closely spaced relation along said layer, said elements of said series being disposed to permit a person's finger to be disposed thereacross in the proximate presence thereof to provide an input signal from each element, said series including more of said elements than can be covered by a person's finger to permit the fingerprint portion of a person's finger to be disposed in the proximate presence of a first group of said elements defining a first pattern of said elements and when moved across said series of elements to be disposed in the proximate presence of a second group of said elements defining a second pattern of elements, means for detecting the proximate presence of the finger with respect to the elements of each said pattern thereof, means for comparing the second pattern with the first pattern, and means for detecting the motion of said finger derived from the comparisons made between said first and second patterns.

9. In a touch activated controller for generating signals adapted to be coupled to operate apparatus comprising a layer of insulation material, a series of sensing lines distributed in closely spaced relation along said layer, said series of sense lines being arranged to include a plurality of groups of a predetermined number of sequentially arranged sense lines disposed in a cyclically recurring sequence of stages, a spacing layer of predetermined uniform thickness carried across said sense lines to be contacted by a person's finger to dispose the fingerprint portion of the finger in the proximate presence of some of the sense lines of one of said groups to provide an input signal from each said sense line, a series of discrete sensing circuit means corresponding in number to said predetermined number of sense lines of one of said groups thereof, each said sensing circuit means being coupled in common to a sense line at the same stage of each said group whereby each sensing circuit means is coupled to more than one sense line to permit the pattern of sense lines in the proximate presence of the fingerprint portion of a finger to move from one group to the next.

* * * * *